United States Patent [19]

Watanabe et al.

[11] Patent Number: 5,658,417
[45] Date of Patent: Aug. 19, 1997

[54] HF VAPOR SELECTIVE ETCHING METHOD AND APPARATUS

[75] Inventors: Hirohito Watanabe; Mitsusuke Kyogoku, both of Tokyo, Japan

[73] Assignees: NEC Corporation, Tokyo; ASM Japan K.K., Tama, both of Japan

[21] Appl. No.: 447,557

[22] Filed: May 23, 1995

Related U.S. Application Data

[62] Division of Ser. No. 162,658, Dec. 7, 1993, abandoned.

[30] Foreign Application Priority Data

Dec. 8, 1992 [JP] Japan ................................ 4-327907

[51] Int. Cl.$^6$ ................................................ H01L 21/306
[52] U.S. Cl. .......................... 156/345; 118/715; 118/725
[58] Field of Search ........................... 118/715, 725; 156/345; 216/73, 58

[56] References Cited

U.S. PATENT DOCUMENTS

| | | | |
|---|---|---|---|
| 4,127,437 | 11/1978 | Bersin et al. | 156/635 |
| 4,421,786 | 12/1983 | Mahajan et al. | 156/611 |
| 4,749,440 | 6/1988 | Blackwood et al. | 156/646 |
| 5,022,961 | 6/1991 | Izumi et al. | 156/646 |
| 5,100,495 | 3/1992 | Ohmi et al. | 156/345 |
| 5,158,100 | 10/1992 | Tanaka et al. | 134/105 |
| 5,173,152 | 12/1992 | Tanaka | 156/646.1 |
| 5,273,423 | 12/1993 | Shiraiwa | 432/241 |
| 5,279,670 | 1/1994 | Watanabe et al. | 118/725 |
| 5,294,572 | 3/1994 | Granneman et al. | 118/725 |
| 5,308,955 | 5/1994 | Watanabe | 118/725 |
| 5,376,223 | 12/1994 | Man | 156/622 |
| 5,376,233 | 12/1994 | Man | 156/662.1 |

FOREIGN PATENT DOCUMENTS

| | | |
|---|---|---|
| 0 036 061 | 9/1981 | European Pat. Off. . |
| 0 340 345 | 11/1989 | European Pat. Off. . |
| 0 354 669 | 2/1990 | European Pat. Off. . |
| 0 421 315 | 4/1991 | European Pat. Off. . |
| 0 628 993 | 12/1994 | European Pat. Off. . |
| 55-125632 | 9/1980 | Japan . |
| 56-88320 | 7/1981 | Japan . |
| 61-007631 | 1/1986 | Japan . |
| 62-143428 | 6/1987 | Japan . |
| 01305513 | 12/1989 | Japan . |
| 03200322 | 9/1991 | Japan . |
| 04215429 | 8/1992 | Japan . |
| WO 87/01508 | 3/1987 | WIPO . |
| WO90/12419 | 10/1990 | WIPO . |
| WO91/06975 | 5/1991 | WIPO . |

OTHER PUBLICATIONS

M. Wong et al., "Characterization of Wafer Cleaning and Oxide Etching Using Vapor–Phase Hydrogen Fluoride," *Journal of the Electrochemical Society*, vol. 138, No. 6, (1991) Jun., Manchester, NH, US, pp. 1799–1802.

(List continued on next page.)

*Primary Examiner*—R. Bruce Breneman
*Assistant Examiner*—George Goudreau
*Attorney, Agent, or Firm*—Burns, Doane, Swecker & Mathis, LLP

[57] ABSTRACT

In order to study an etching rate difference of a layer formed mainly with silicon dioxide on a wafer, a thermal oxide film (113) and layers of BSG (117), BPSG (125), and PSG (129) are laminated on a wafer and are etched in a gaseous etching atmosphere consisting essentially of hydrogen fluoride or a mixture of hydrogen fluoride and water vapor. The layers are etched with various etching rates which are higher than that of the thermal oxide film. The etching rate difference is a difference between the etching rate of each layer and an etching rate of the thermal oxide film. The layers may include impurities, such as boron and phosphorus, collectively as a part of a layer material of each layer. The etching rate difference depends on the layer material. Preferably, the gaseous etching atmosphere should have a reduced pressure. Alternatively, a water vapor partial pressure should not be greater than 2000 Pa. As a further alternative, either the layer or the gaseous etching atmosphere should be heated.

2 Claims, 9 Drawing Sheets

OTHER PUBLICATIONS

A. Izumi et al., "A New Cleaning Method by Using Anhydrous HF/CH$_3$OH Vapor System," *Japanese Journal of Applied Physics*, Extended Abstracts of the 1991 Int. Conf. on Solid State Devices and Materials, Aug. 27–29, 1991, pp. 135–137.

N. Miki et al., "Selective Etching of Native Oxide by Dry Processing Using Ultra Clean Anhydrous Hydrogen Fluoride," *Tech. Dig. on Int. Electron Devices Meeting*, San Francisco, CA., Dec. 11–14, 1988, pp. 730–733.

Nobuhiro Miki et al., "Gas–Phase Selective Etching of Native Oxide," *IEEE Transactions on Electron Devices*, vol. 37, No. 1, Jan. 1990, pp. 107–115.

HF VAPOR SELECTIVE ETCHING METHOD AND APPARATUS

This application is a divisional of application Ser. No. 08/162,658, filed Dec. 7, 1993, now abandoned.

BACKGROUND OF THE INVENTION

This invention relates to a method of manufacturing semiconductor devices and apparatus for the method and, in particular, to a method of etching a layer on a wafer.

Recently, with an increasing degree of integration of a semiconductor device, reduction of the number of particles has become an important issue.

To decrease the particles, a vapour-phase cleaning method has been investigated, in particular, vapour-phase hydrogen fluoride (HF) treatment is investigated as an effective method to remove native oxide and obtain a clean surface. An apparatus and method for removing native oxide layers are disclosed in PCT International Publication No. WO91/06795.

On the other hand, a new phenomenon, that an etching rate greatly depends on properties of the objective layers in vapour-phase etching, is also observed. The phenomenon is described in a paper contributed by Nobuhiro Miki and four others to the IEEE Transactions on Electron Devices, Vol. 37, No. 1 (January 1990), pages 107–115, under the title of "Gas-Phase Selective Etching of Native Oxide". The Miki et al paper reports that an etching rate of the objective layers considerably varies when a water vapour concentration in the vapour-phase hydrogen fluoride is controlled and that a change in etching rate depends on the properties, in particular, compositions of the objective layers.

More particularly, the Miki et al paper reports that reducing of the water vapour concentration in the vapour phase to 0.1 ppm or less enables selective removal of objective layers consisting of phospho-silicate glass (PSG). The process has the advantage that the objective layers can selectively be removed without etching of layers other than the objective layers.

However, the selective etching process of the Miki et al paper requires strict control of a vapour-phase hydrogen fluoride concentration and of the water vapour concentration. Reducing the water vapour concentration to less than a few ppm as described in the Miki et al paper is very difficult and costly for the following reasons. In order to reduce the water vapour concentration, the concentration of impurities in the vapour-phase hydrogen fluoride must be extremely reduced. Furthermore, an etching chamber for the selective etching process must have a structure which avoids mixing of the surrounding atmosphere and the like into the etching chamber and adherence of water to the etching chamber. In addition, etching the objective layers with vapour-phase hydrogen fluoride produces water as a reaction product. Therefore, the water vapour concentration undesiredly increases to adversely affect stable progress of the selective etching process.

SUMMARY OF THE INVENTION

An object of the present invention is to provide a silicon oxide etching process and system that increases the difference in an etch rate caused by a difference in quality or impurity concentration in the silicon dioxide layers so that silicon oxide with a specific quality can be selectively etched in a stable way at wide process conditions.

Herein, the etching rate difference means a difference between the etching rate of the specific layer and that of an oxide layer.

According to an aspect of this invention, there is provided a method of etching at room temperature a silicon oxide layer formed on a wafer in a gaseous etching atmosphere consisting essentially of hydrogen fluoride or a mixture of hydrogen fluoride and water vapour, the silicon oxide layer being doped with an impurity into a doped oxide layer and left undoped as an undoped oxide layer, the gaseous etching atmosphere being given a reduced pressure with a water vapour partial pressure rendered lower than a predetermined pressure in order to increase an etching rate difference between the doped oxide layer and the undoped oxide layer and to selectively etch the doped oxide layer of a specific impurity concentration.

According to another aspect of this invention, there is provided a method of etching a silicon dioxide layer formed on a wafer in a gaseous etching atmosphere consisting essentially of hydrogen fluoride or a mixture of hydrogen fluoride and water vapour, the silicon oxide layer being doped with an impurity into a doped oxide layer and left undoped as an undoped oxide layer, the silicon oxide layer being etched at a temperature higher than room temperature in order to increase an etching rate difference between the doped oxide layer and the undoped oxide layer and to selectively etch the doped oxide layer of a specific impurity concentration.

According to still another aspect of this invention, there is provided a method of etching a silicon oxide layer formed on a wafer in a gaseous etching atmosphere consisting essentially of hydrogen fluoride or mixture of hydrogen fluoride and water vapour, the silicon oxide layer being doped with an impurity into a doped oxide layer and left undoped as an undoped oxide layer, the gaseous etching atmosphere being heated to a temperature higher than room temperature in order to increase an etching rate difference between the doped oxide layer and the undoped oxide layer and to selectively etch the doped oxide layer of a specific impurity concentration.

According to yet another aspect of this invention, there is provided a method of etching a silicon oxide layer formed on a wafer in a gaseous etching atmosphere consisting essentially of hydrogen fluoride or a mixture of hydrogen fluoride and water vapour, the silicon oxide layer being doped with an impurity into a doped oxide layer and left undoped as an undoped oxide layer, the gaseous etching atmosphere being added in order to increase an etching rate difference between the doped oxide layer and the undoped oxide layer and to selectively etch the doped oxide layer of a specific impurity concentration, with a gas which causes a liquid adsorption layer comprising hydrogen fluoride and water and formed on the undoped oxide layer to volatilize.

According to a different aspect of this invention, there is provided apparatus for etching a silicon oxide layer formed on each of wafers in a gaseous etching atmosphere consisting essentially of hydrogen fluoride or a mixture of hydrogen fluoride and water vapour, the apparatus comprising: (A) a reaction chamber in which an etching process takes place; (B) a wafer boat for holding the wafers with a predetermined space left between two adjacent ones of the wafers; (C) a transfer chamber which is located below the reaction chamber and in which the wafer boat is loaded with the wafers; (D) a boat transfer mechanism for transferring the wafer boat from the transfer chamber to the reaction chamber; and (E) a sealing mechanism for isolating the reaction chamber from the transfer chamber; the wafer boat comprising heating means for individually heating the wafers.

DESCRIPTION OF THE PREFERRED EMBODIMENTS

Figure 1A:
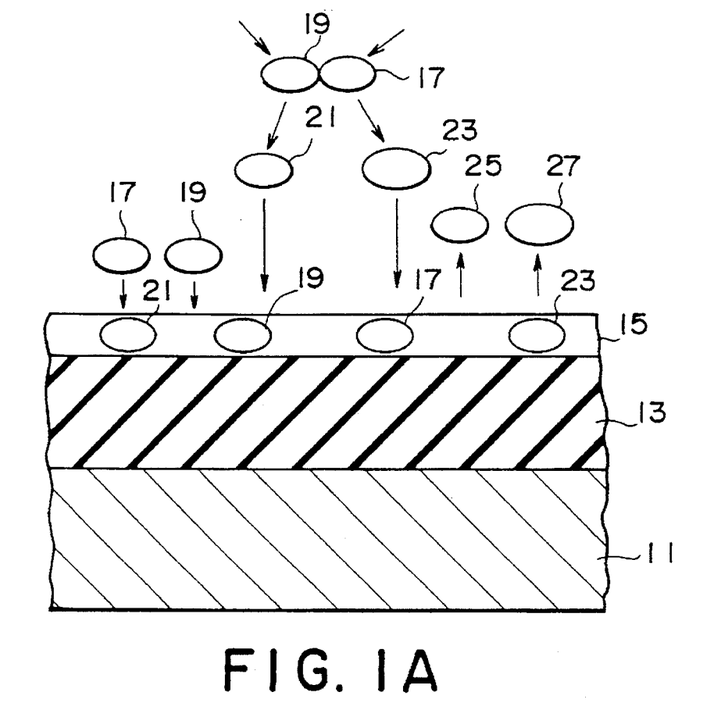
FIGS. 1A and 1B schematically show, each in a vertical section, side views of a substrate for use in describing principles of the present invention.
Figure 1B:
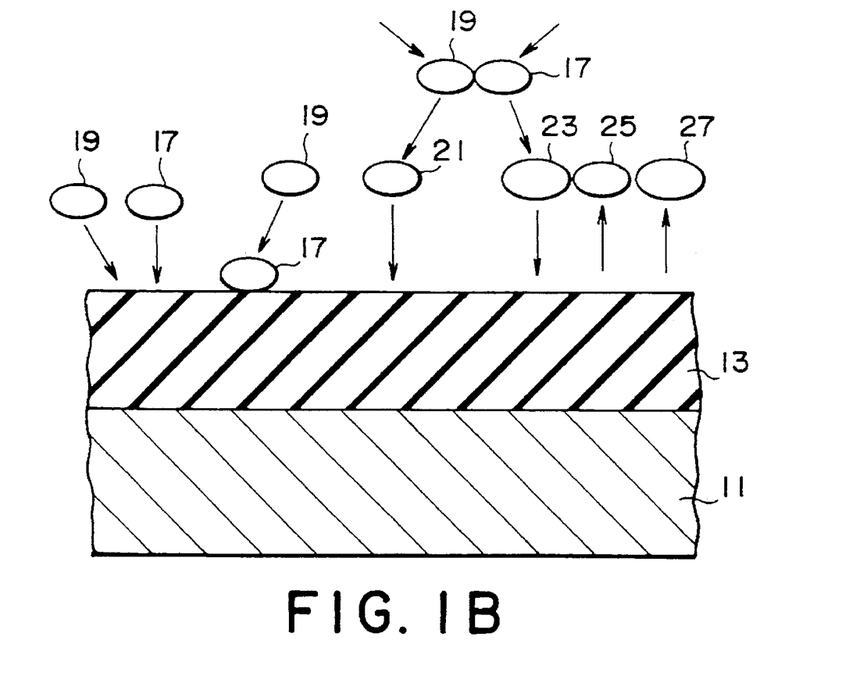

Referring to FIGS. 1A and 1B, a wafer is partly depicted. The wafer is a semiconductor silicon substrate 11 which is covered with a silicon dioxide film 13.

In FIG. 1A, a liquid adsorption layer 15 is formed when the wafer 11 (the same numeral being used) with the silicon dioxide film 13 is exposed to a humid etching gas atmosphere which is composed of water vapour molecules (shown at 17) and hydrogen fluoride molecules (shown at 19)

This liquid adsorption layer 15 is composed of HF and $H_2O$ at an initial stage. Therefore, a high etching rate is observed. This is caused by the efficient HF ionization in the liquid adsorption layer 15. Hydrogen fluoride anions 21 and water cations 23 are formed when HF is ionized in the liquid adsorption layer 15. Silicon fluoride 27 and $H_2O$ are formed when HF ions react with the silicon dioxide film 13.

The etching mechanism of the silicon dioxide film 13 by using anhydrous HF gas is shown in FIG. 1B. Under the anhydrous HF ambience, the adsorption layer 15 does not form on the silicon dioxide film 13. Therefore, HF gas is hardly ionized as compared with the HF and $H_2O$ gas mixture. As a consequence, the silicon dioxide film 13 is etched with a low etching rate.

FIGS. 1A and 1B will be reviewed. Water exists in the gaseous etching atmosphere as an impurity or as a product of the etching reaction. A reduction of a pressure of the gaseous etching atmosphere will reduce the water vapour partial pressure in the reaction chamber.

In addition, the silicon dioxide film 13 is essentially hydrophilic so that the silicon dioxide film easily becomes wet. When the water vapour partial pressure is high, the water is adsorbed on the surface of the silicon oxide film 13 forming a liquid layer, such as the liquid adsorption layer 15.

On the other hand, when the water vapour partial pressure is low, the water vapour is stabler than water in the liquid phase. Therefore, the silicon dioxide film does not become wet at the surface in the gaseous etching atmosphere with a low total pressure.

Continuing review of FIGS. 1A and 1B, attention will be directed to an objective layer which is formed on the wafer or the substrate and is etched with a gaseous etching atmosphere. The silicon dioxide film 13 is the objective layer when impurities, for example, phosphorus (P) and boron (B), are contained therein. The objective layer is therefore made of a layer material comprising silicon dioxide. Either the humid etching atmosphere or the relatively dry etching atmosphere serves as the gaseous etching atmosphere. Therefore, the gaseous etching atmosphere consists essentially of hydrogen fluoride or a mixture of hydrogen fluoride and water vapour. A reaction takes place between the impurities and both the hydrogen fluoride anions 21 and water cations 23 irrespective of whether the gaseous etching atmosphere is the humid etching atmosphere or the relatively dry etching atmosphere. As a result of the reaction, hydrates of the impurities are produced on the objective layer. The hydrates are a hygroscopicity, resulting in the liquid adsorption layer 15 formed on the objective layer. Therefore, a high etching rate of the objective layer is attained even if the gaseous etching atmosphere is the relatively dry etching atmosphere.

Table 1 shows those hydrates of various chemical elements by percent by weight except for hydroxide radicals which result from a properly etched phosphorus silicate glass (PSG) layer containing 3.9 mol percent of phosphorus (P) and from an overetched boron phosphorus silicon glass (BPSG) layer containing 10 mol percent of boron (B) and 4.4 mol percent of phosphorus. In the hydrates, the chemical elements are boron, pentavalent phosphorus (P(V)) in a radical ion $PO_4^{3-}$, trivalent phosphorus (P(III)) in another radical ion $HPO_3^{2-}$, and silicon (Si) of such objective layers and fluorine (F) of the gaseous etching atmosphere.

TABLE 1

|  | B | P(V) ($PO_4^{3-}$) | P(III) ($HPO_3^{2-}$) | (wt %) Si | F |
|---|---|---|---|---|---|
| PSG P: 3.9 mol % (properly etched) | — | 97.30 | 2.67 | 0.01 | 0.02 |
| BPSG P: 4.4 mol % B: 10 mol % (over etched) | 5.07 | 86.34 | 1.48 | 0.01 | 7.1 |

In Table 1, it should be noted that the hydrates mostly comprise phosphoric acid ($H_3PO_4$) compound. Like other compounds, the hydrates of the phosphoric acid are highly hygroscopic. The phosphoric acid hydrates easily form the liquid adsorption layer 15. The hydrogen fluoride molecules 19 and the water molecules are ionized in the liquid adsorption layer 15 into the hydrogen fluoride anions 21 and the water cations 23. The hydrogen fluoride anions 21 react with the objective layer together with the water cations 23. Therefore, the objective layer is etched with a high etching rate.

When the silicon dioxide film 13 is a thermal oxide layer, the liquid adsorption layer 15 is not made on the surface in the relatively dry etching atmosphere. The thermal oxide layer is etched with a low etching rate. Therefore, the objective layer should preferably include the impurities.

Selective etching can be realized without strict control of water vapour partial pressure in the gaseous etching atmosphere with a low total pressure.

FIGS. 1A and 1B will continuously be referred to. It will be assured that the objective layer is the thermal oxide layer. Selective etching can be attained by heating either the gaseous etching atmosphere or the substrate 11 to be etched, because of the following reasons. Existence of the liquid adsorption layer 15 on the silicon dioxide film 13 influences the etching rate of the silicon dioxide film 13. Heating either the gaseous etching atmosphere or the substrate 11 gives heat energy to the water molecules 17 and hydrogen fluoride molecules 19 of gaseous etching atmosphere. When given the heat energy, the water molecules 17 and hydrogen fluoride molecules 19 are stabler than water in the liquid phase. Therefore, the liquid adsorption layer 15 is hardly formed on the silicon dioxide film 13. It will now be assumed that the objective layer includes the impurities. The liquid adsorption layer 15 is formed on the objective layer which now contains the hydrates. The hydrates have a low vapour pressure. Heating neither the gaseous etching atmosphere nor the substrate 11 can remove the hydrates. Therefore, the etching rate of the objective layer does not depend on heating. The objective layer is etched with a high etching rate.

Herein, a reduction of a total pressure of the humid etching atmosphere produces the relatively dry etching atmosphere, for the following reasons. The pressure of the humid etching atmosphere consists of a hydrogen fluoride partial pressure and a water vapour pressure. Reduction of the total pressure of the humid etching atmosphere reduces not only the hydrogen fluoride partial pressure but also the water vapour pressure. Reduction of the water vapour pressure makes the humid etching atmosphere relatively dry. When the total pressure of the humid etching atmosphere is given a reduced total pressure, a similar effect results on the etching rate as in the relatively dry etching atmosphere with respect to the etching rate of the silicon dioxide film 13.

The selective etching can be obtained by adding to the gaseous etching atmosphere a gas which lowers a boiling point of the atmosphere and causes a liquid adsorption layer 15 to volatilize. The gas is, for example, ethanol, methanol, n-propanol, isopropyl-alcohol, tertiary butylalcohol, or acetone and will be called a volatilization accelerating gas. By addition of the gas, the silicon dioxide film 13 is etched with a low etching rate. However, the objective layer is etched with a high etching rate, because the liquid adsorption layer 15 contains the hydrates.

After an etching reaction takes place in the gaseous etching atmosphere, the water molecules 17 and the hydrates are produced on the wafer 11 or on the objective layer. The water molecules 17 and the hydrates form the liquid adsorption layer 15. Water molecules 17 can be easily removed by heating the substrate 11. However, the hydrates can not be removed only by heating but can be removed by addition of a halogen gas, such as fluorine, to the gaseous etching atmosphere at the same time of heating. By addition of halogen gas, a reaction takes place between hydrates and the halogen gas. As a result of the reaction, the hydrates volatilize into the gaseous etching atmosphere.

Figure 2:
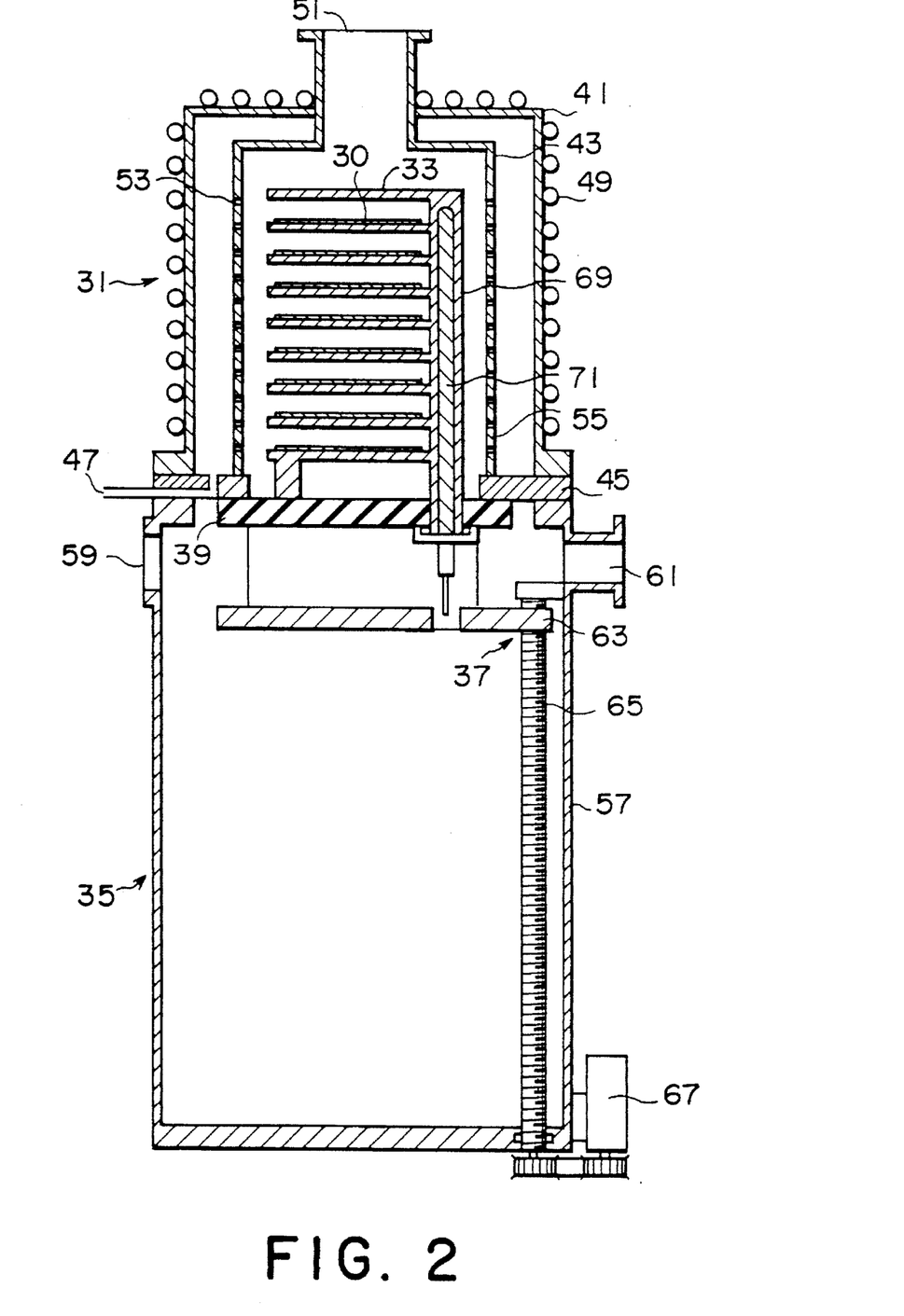
FIG. 2 schematically shows in a vertical section a side view of apparatus according to a first embodiment of this invention.

Referring to FIG. 2, the description will be made as regards apparatus according to a first embodiment of this invention. The apparatus is for etching the objective layer described with reference to FIGS. 1A and 1B and formed on each of a plurality of wafers 30 (now designated by a different reference numeral) in a gaseous etching atmosphere of hydrogen fluoride or a mixture of hydrogen fluoride and water vapour. The apparatus comprises a reaction chamber 31, a wafer boat 33, a transfer chamber 35, a moving or transfer mechanism 37, and a flange or sealing member 39.

In the reaction chamber 31, the objective layers of the wafers 30 are etched. The wafer boat 33 holds the wafers 30 with a certain space left between two adjacent ones of the wafers 30 in the manner illustrated.

In the transfer chamber 35, the wafer boat 33 is first placed together with the wafers 30. The transfer mechanism 37 transfers the wafer boat 33 with the wafers 30 from the transfer chamber 35 to the reaction chamber 31. The flange 39 is provided in the transfer chamber 35 and isolates the reaction chamber 31 from the transfer chamber 35. The mentioned wafer boat 33 comprises a heating unit to heat the individual wafers.

The reaction chamber 31 comprises an external tube 41, an inner tube 43 in the external tube 41, and a reaction tube base 45 which fixes the inner tube 41 to the external tube 41. A gas inlet tube 47 is connected to the external tube 41 for introducing the gaseous etching atmosphere into the reaction cheer 31. The external tube 41 is surrounded by a reaction tube heater unit 49 for heating the reaction chamber 31 together with its inner contents. The inner tube 43 has a gas outlet tube 51 and through holes 53 through a tube wall 55 of the inner tube 43. The gas outlet tube 51 is connected to a top of the external tube 41 and thence to a gas exhaust system (not shown) for evacuating the reaction chamber 31. A combination of the gas outlet tube 51 and a space between the external and the inner tubes 41 and 43 serves as an introducing arrangement or means. The reaction tube heater unit 49 may be an electric heater or a heating pipe for circulating hot water.

The transfer chamber 35 comprises a vessel 57. The vessel 57 has a wafer inlet and outlet opening 59 and a gas outlet 61. The transfer mechanism 37 comprises a movable body 63, and a ball screw 65 placed vertically for moving the movable body 63 upwards and downwards. A motor 67 is placed outside of the vessel 57. The motor 67 rotates the ball screw 65 so that the movable body 63 moves upwards and downwards together with the wafer boat 33. The wafer boat 33 is held by a wafer boat leg 69 with a predetermined space. The wafers 30 are transferred from outside of the vessel 57 through the wafer inlet opening 59 to the wafer boat 33. The gas outlet 61 is connected to the exhaust system for evacuation of the vessel 57. The leg 69 includes a wafer boat heater unit 71. The wafer boat heater unit 71 heats the leg 69, resulting in heating both of the wafer boat 33 and the wafers 30 placed on the wafer boat 33. The wafer boat 33 may be made of a thin carbon heater or a thin silicon carbide heater, which heats the boat 33 directly.

When the wafer inlet opening 59 opens to a surrounding atmosphere of one atmospheric pressure, the opening 59 must be isolated by a gate valve (not shown). After transference of the wafers 30 to the wafer boat 33, the reaction chamber 31 and the transfer chamber 35 are evacuated through the gas outlet 61. The wafer boat 33 is moved into the etching chamber 31 by the transfer mechanism 37 provided in the transfer chamber 35. When the flange 39 isolates the reaction chamber 31 from the transfer chamber 35 perfectly, the wafer boat 33 is placed at a predetermined position. The reaction chamber 31 and the boat 33 are heated by the heater units 71 and 49 up to a predetermined temperature, such as 70° C.

Through the introducing arrangement, the gaseous etching atmosphere is introduced into the inner tube 43 through the gas inlet tube 47, the space between the external and the inner tubes 41 and 43, and the through holes 53 which are formed through the tube wall 55 at positions between upper and lower levels of each wafer 30 support on the boat 33. The gaseous etching atmosphere supplies for the objective layer etching. After completion of the chemical reaction, introduction of the gaseous etching atmosphere is suspended. The gas etching atmosphere is exhausted from the inner tube 43 through the outlet tube 51. When the pressure of the reaction chamber 31 becomes equal to that of the transfer chamber 35, the flange 39 is moved downwards to open. The boat 33 is moved downward together with the flange 39. The wafers 30 are taken out from the opening 59 outside the apparatus.

Figure 3:
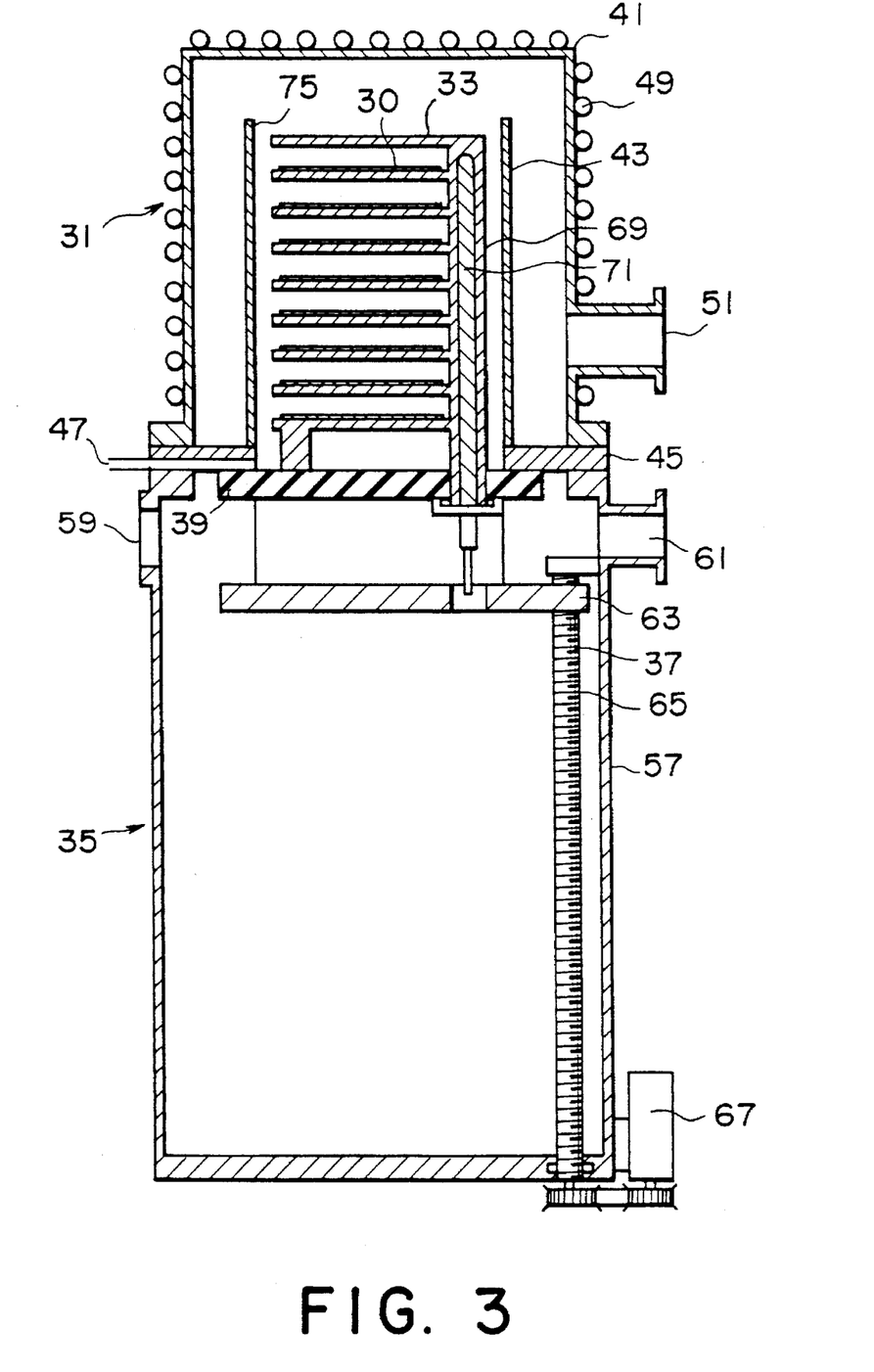
FIG. 3 schematically shows in a vertical section a side view of apparatus according to a second embodiment of this invention.

Turning to FIG. 3, the description will be directed to apparatus according to a second embodiment of this invention. The apparatus comprises similar parts designated by like reference numerals.

In FIG. 3, the apparatus differs from the apparatus of FIG. 2 in the following. The inner tube 43 has no through holes in the tube wall 55 but an aperture 75 at an upper end of the tube wall 55. The aperture 75 is opened to the space between the external tube 41 and the inner tube 43. The gas outlet tube 51 is placed at a side portion of the external tube 41 rather than at the top of the inner tube 43. In addition, the introducing arrangement or means comprises the gas inlet tube 47. Through the introducing arrangement, the gaseous etching atmosphere is introduced into the inner tube 43 through the gas inlet tube 47. The gaseous etching atmosphere gives rise to the predetermined chemical reaction with the objective layers. After completion of the chemical reaction, the gaseous etching atmosphere including the reaction products are exhausted through the aperture 75, the space between the external and the inner tubes 41 and 43, and the gas outlet tube 51 from the reaction chamber 31.

Figure 4:
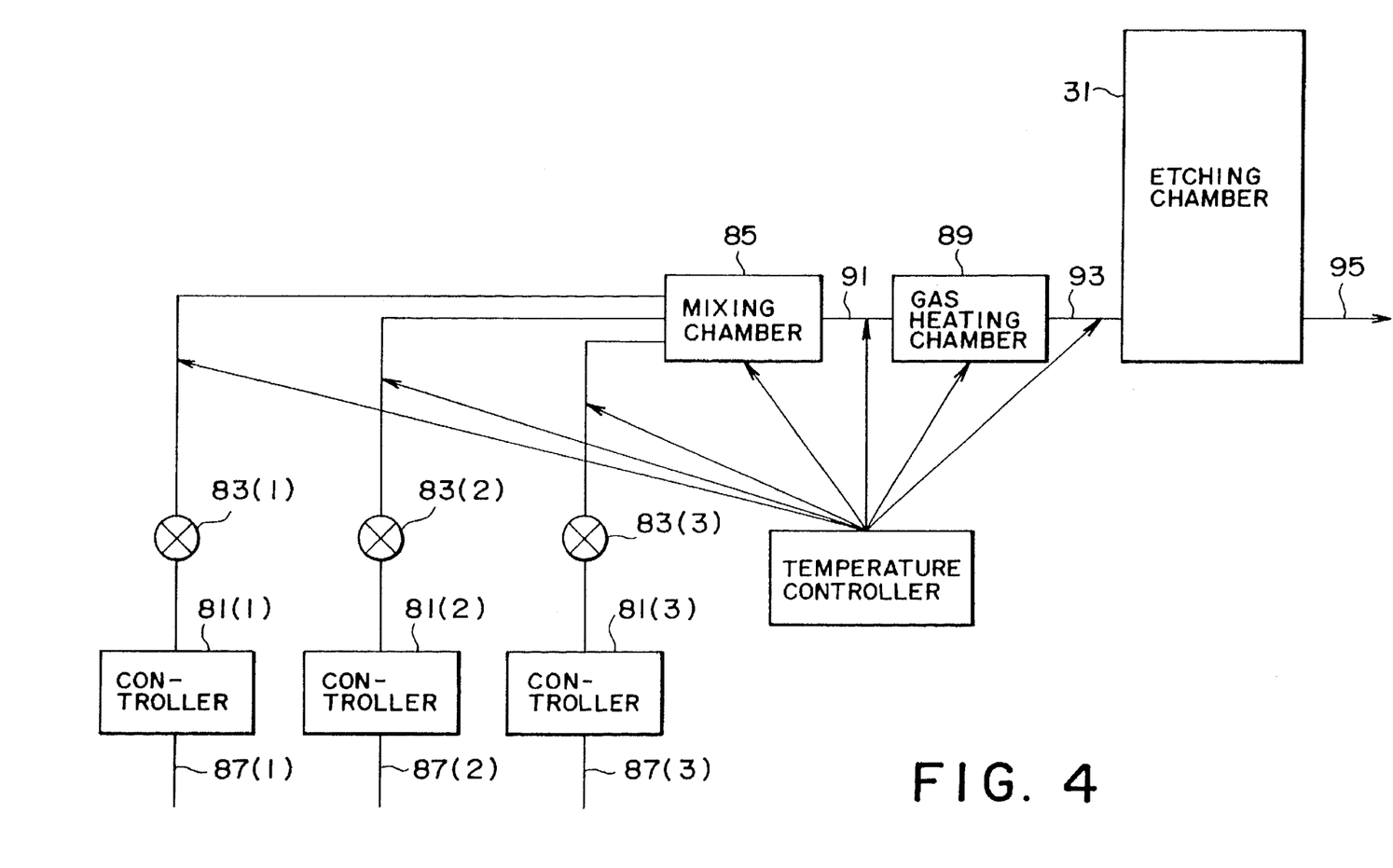
FIG. 4 schematically shows a gaseous etching atmosphere supplying system according to the present invention.

Referring to FIG. 4, an etching gas supplying system comprises first, second, and third gas flow controllers 81(1), 81(2), and 81(3), first, second, and third valves 83(1), 83(2), and 83(3), a gas mixing chamber 85, first, second, and third inlet pipes 87(1), 87(2), and 87(3) connected to the gas flow controllers 81 (suffixes omitted) and between the gas flow controllers 81, a gas heating chamber 89, first and second connecting pipes 91 and 93 connected to the reaction chamber 31, and the outlet pipe 95. A temperature control system 97 is for controlling the temperature of the etching gas supplying system.

Free ends of the first, the second, and the third inlet pipes 87 (suffixes omitted) are connected to three raw gas reservoirs (not shown) for water vapour, hydrogen fluoride, and the volatilization accelerating gas, respectively. In the gas mixing chamber 85, the raw gases are mixed into the gaseous etching atmosphere.

For heating the gaseous etching atmosphere, heated pipes may be used in place of the connecting pipes 91 and 93 and the gas heating chamber 89. Furthermore, a heater unit (not shown) may be placed adjacent to the inlet tube 47 (FIG. 2 or 3) inside the reaction chamber 31. In this event, the heating chamber 89 is unnecessary with the connecting pipes 91 and 93 directly connected to each other.

Referring again to FIGS. 1A, 1B, and 2 to 4, the apparatus is put into operation as follows. FIGS. 5, 6, 7, 8, and 9 will additionally be referred to.

EXAMPLE 1

After the wafers 30 were loaded in the reaction chamber 31 and the reaction chamber 31 was evacuated to an ultimate pressure (0.1 Pa), the valve 83(1) was opened to introduce water vapour in the reaction chamber 31 up to a water vapour pressure of 300 Pa. Subsequently, the valve 83(2) was opened to introduce hydrogen flouride with a purity of 99.999% into the reaction chamber 31 up to a hydrogen flouride partial pressure of 600 Pa. Subsequently, the reaction chamber was isolated. The total pressure of etching gases was 900 Pa, with which silicon oxides were etched. In a similar way, an etching environment consisting of 600 Pa hydrogen flouride only was used.

As a reference, silicon oxide layers were etched in an aqueous solution of hydrogen flouride. The aqueous solution of hydrogen fluoride was obtained by mixing hydrogen fluoride and pure water in a ratio of 1:30 by weight percent.

The hydrogen fluoride solution was kept at room temperature in a vessel made of polytetrafluoroethylene (not shown). To investigate the etching rate of silicon oxide 1000 angstroms, thermal oxide was grown on 6-inch N-type silicon substrate and in addition 10,000 angstroms PSG was deposited on other 6-inch N-type silicon substrate.

Figure 5:
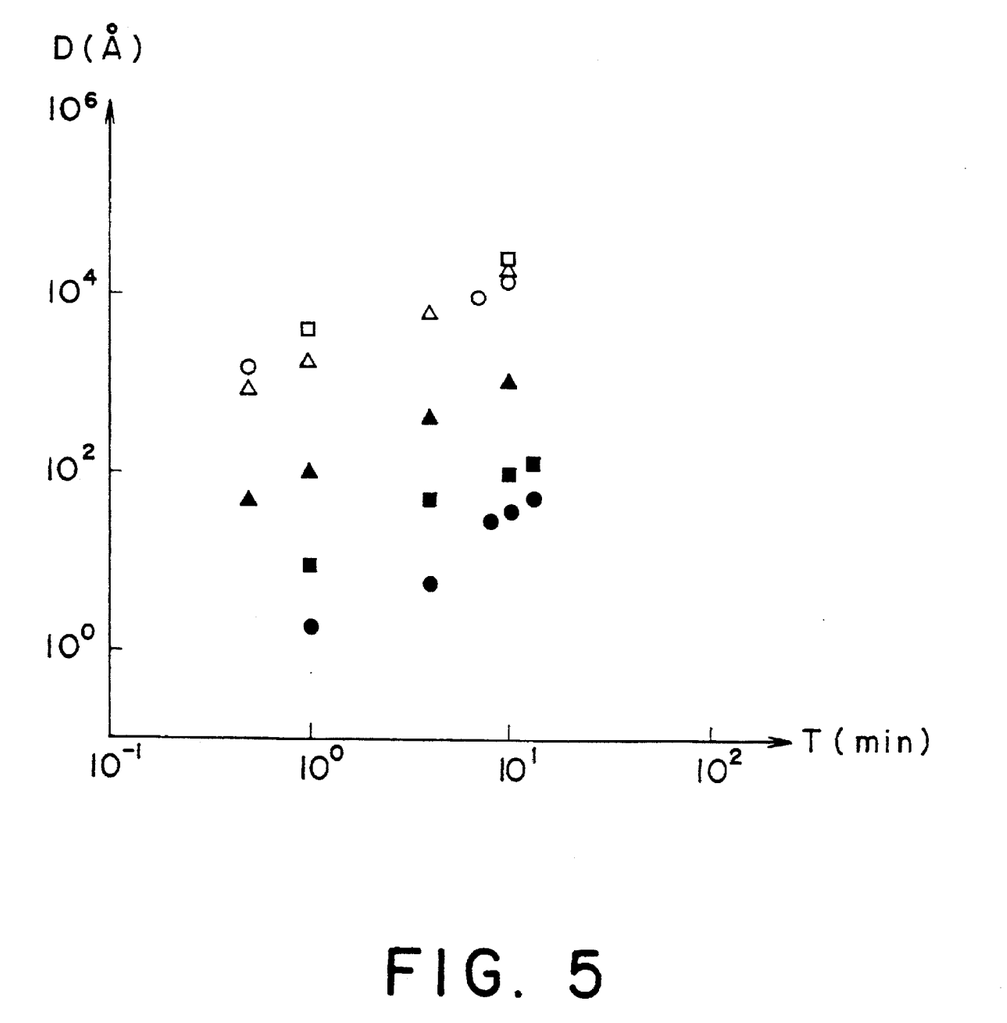
FIG. 5 shows a graph for use in describing etched thicknesses etched by a method according to this invention and by a method used as a reference.

In FIG. 5, the etched thickness of the PSG and the thermal oxide versus the etching time is shown for the three different etching processes mentioned above. The black circles and the white circles represent the etched thermal oxide thickness and the etched PSG thickness respectively, in the hydrogen flouride vapour etching process. The black squares and the white squares represent the etched thermal oxide and the etched PSG thickness respectively in the hydrogen flouride and water vapour mixture. The black triangles and the white triangles represent the etched thermal oxide thickness and the etched PSG thickness respectively in the aqueous hydrogen flouride solution, The etching rate is determined from the slope of the line representing the dependence of the etched oxide thickness and the etching time. The etching rate ratio of PSG to thermal oxide was found to be about 20 for the hydrogen flouride solution. However, in both low pressure vapour phase etching processes the etching rate ratio was higher than 1000.

In this example, the reaction chamber was isolated after introducing the process gases. However, continuous supply of etching gas in combination with continuous removal of byproducts is also possible.

EXAMPLE 2

Figure 6:
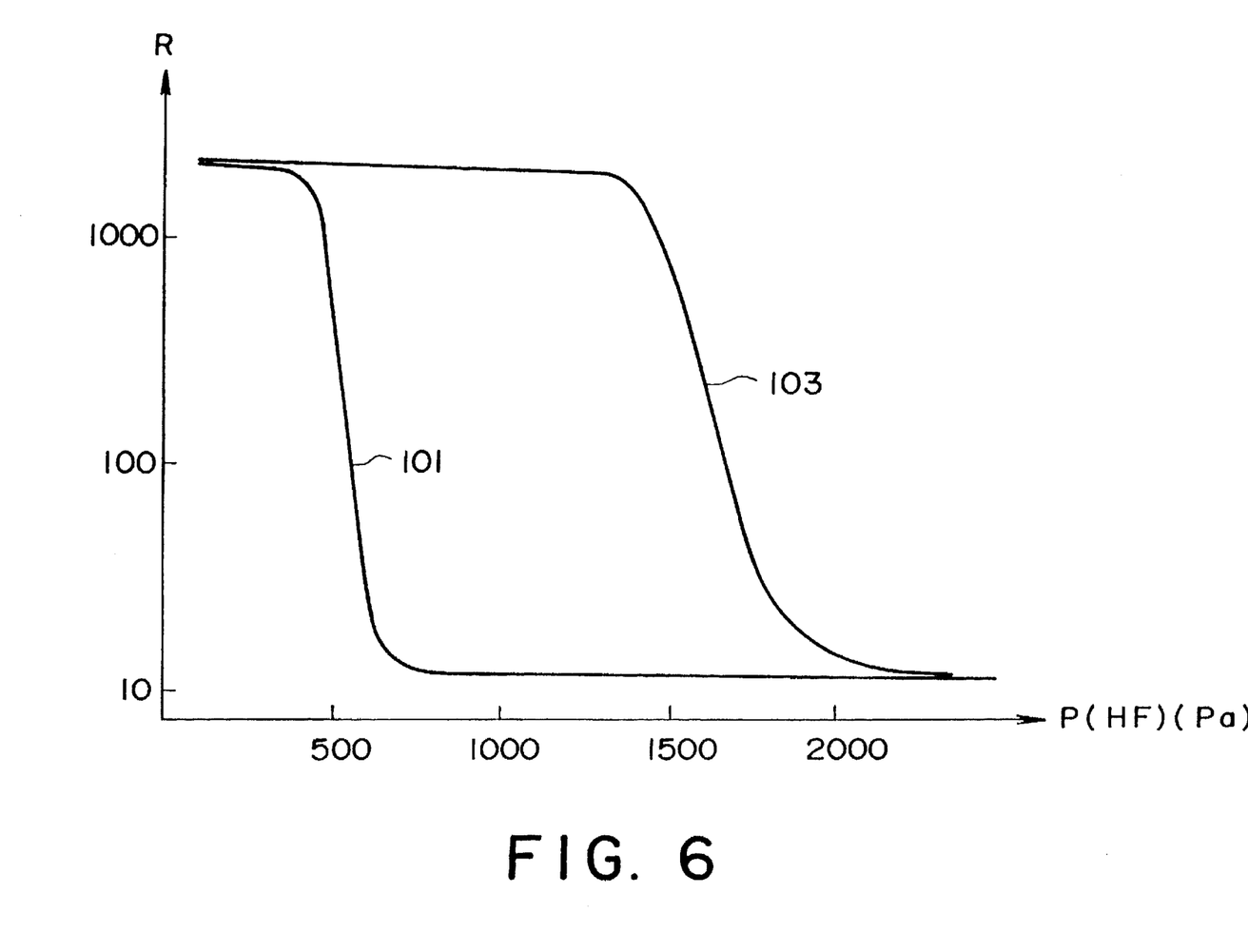
FIG. 6 shows a graph for use in describing etching rate ratios of a method according to this invention.

The etching rate ratio R of BPSG and thermal oxide is shown in FIG. 6 as function of the hydrogen flouride partial pressure for etching in a low pressure environment consisting of hydrogen flouride vapour and water vapor in which the hydrogen flouride partial pressure is varied and the water vapour partial pressure is fixed at 300 Pa (curve 103) or 600 Pa (curve 101). From FIG. 6, it is understood that the etching rate ratio R is lower for higher hydrogen flouride partial pressures and that the etching ratio R is generally higher for the low water vapour partial pressure.

The BPSG layer can be selectively etched at a wide range of hydrogen flouride partial pressures when the water vapour partial pressure is low.

EXAMPLE 3

To investigate the influence of the water vapour pressure, the reaction chamber was evacuated to 0.1 Pa, subsequently the reactor chamber was filled with water vapour to a pressure between 0 and 2000 Pa after which the hydrogen flouride was supplied in such a way that the hydrogen flouride partial pressure in the reaction chamber equaled 600 Pa. The etching process was carried out at 10° C.

Figure 7:
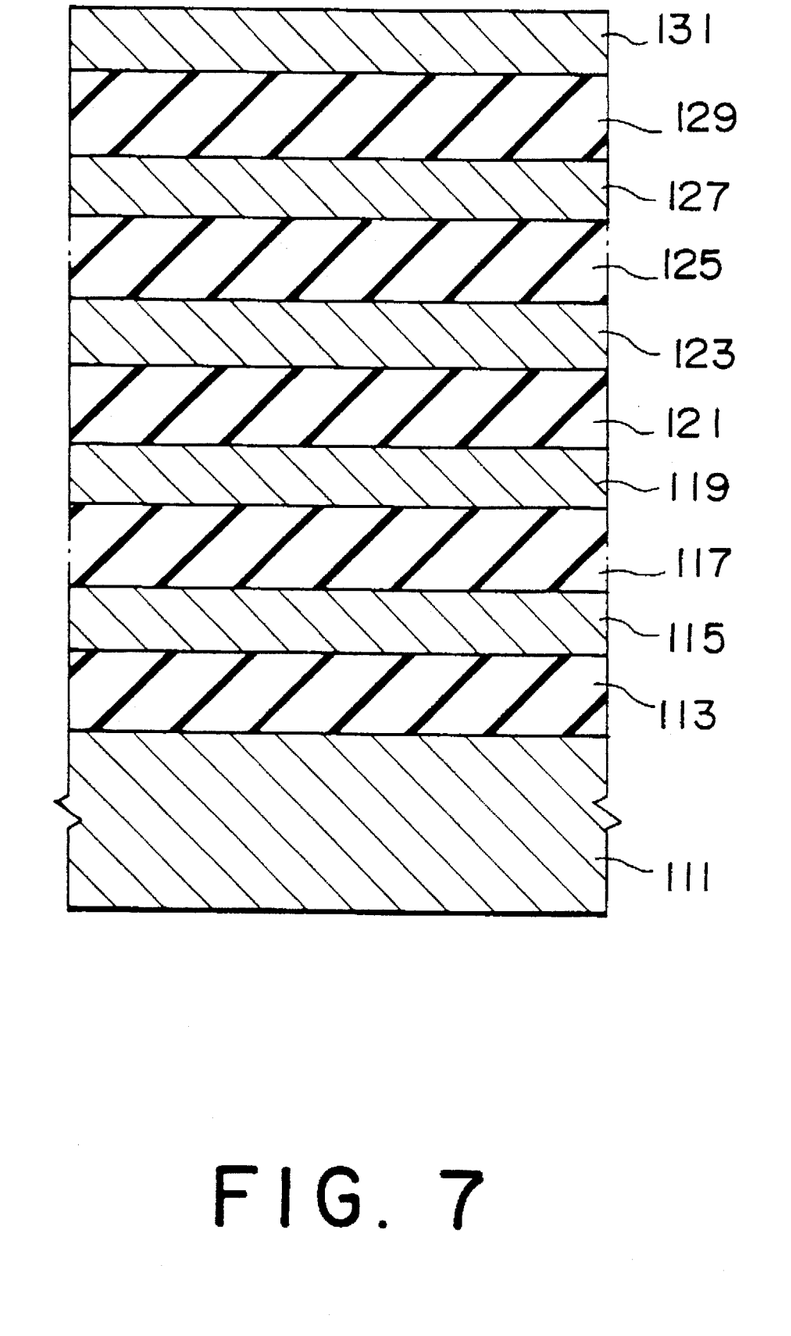
FIG. 7 schematically shows in a vertically sectional view of a plurality of stacked objective layers which are before etched by a method according to this invention.
Figure 8:
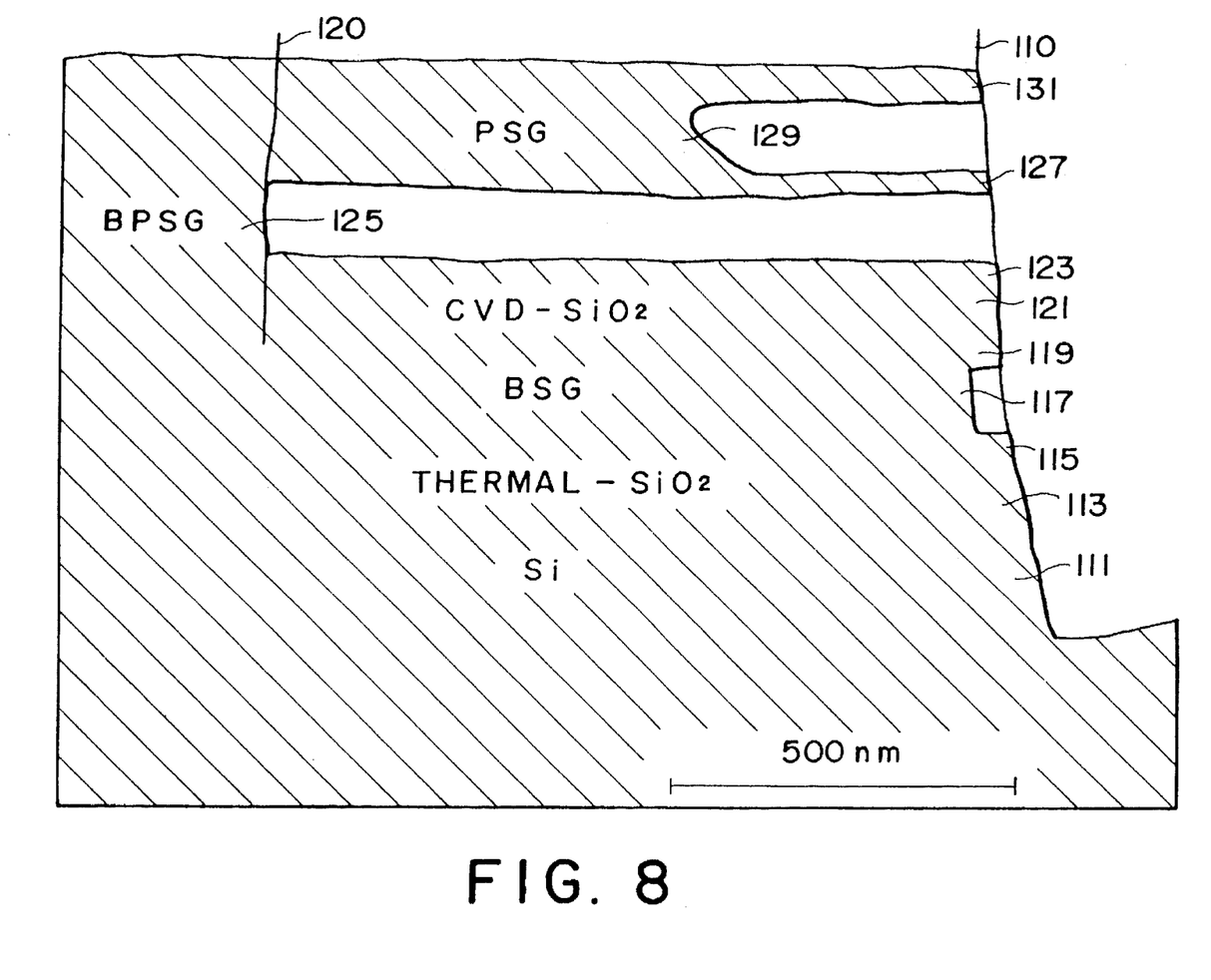
FIG. 8 schematically shows in a vertically sectional view of the stacked objective layers which are after etched.

In FIG. 7, the structure of the used samples is shown. Referring to FIG. 7, the samples consisted of 1000 angstroms thermal oxide film 113 grown on an N-type silicon substrate 111, on this 200 angstroms silicon layer 115 was sputtered, followed by the formation of a 1000 angstroms boron silicate glass (BSG) layer 117 with low pressure chemical vapour deposition (LPCVD). On top of the BSG layer 200 angstroms silicon layer 119 was sputtered on top of which 1000 angstroms silicon oxide layer 121 was formed with LPCVD. On top of the silicon oxide layer 121, 200 angstroms Si layer 123 was sputtered. On top of which 1000 angstroms BPSG layer 125 was formed with LPCVD. On top of the BPSG layer 125 again 200 angstroms silicon layer 127 was sputtered on top of which 1000 angstroms PSG 129 was formed. Finally, a 200 angstroms silicon layer 131 was sputtered on top of the PSG layer 129. The structure described above. After etching for 30 seconds in an environment consisting of 600 Pa hydrogen flouride and 300 Pa water vapour, is shown in FIG. 8. This figure is drawn based on a scanning electron microscope photograph. From this figure, it is clear that the BPSG and PSG were etched much more than the other oxides.

Figure 9:
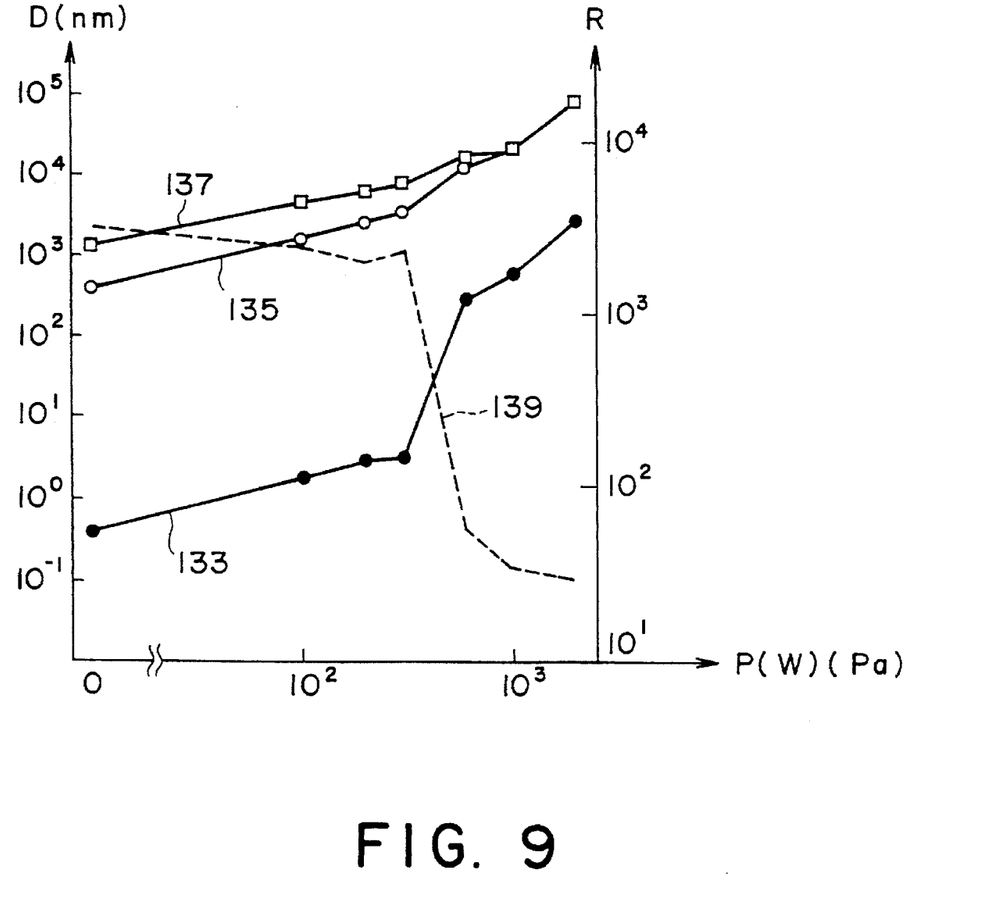
FIG. 9 shows a graph for use in describing the distance mentioned in connection with FIG. 5 and the etching rate ratio mentioned in connection with FIG. 6.

In FIG. 9, the etched thickness of the BPSG, the PSG and the thermal oxides are shown together the etched thickness ratio of BPSG and thermal oxide versus the water vapour partial pressure. The left ordinate represents the etched thickness, the right ordinate the etching ratio and the abscissa the water vapour pressure.

From this figure, it is understood that the etched thickness of the PSG and BPSG layers increases monotonously with increasing water vapour pressure. However, a sudden increase in the etched thickness of thermal oxide is observed when the water vapour pressure is increased above 600 Pa. However, strictly speaking, one cannot say that explosive etching of thermal oxide starts at a water vapour pressure of 600 Pa. In this typical example of etching a multilayer oxide, hydrogen flouride starts reacting with the layers that show a high etching rate like BPSG and PSG. In the reaction the hydrogen from the hydrogen flouride reacts with the oxygen in the oxide film and water is formed at the wafer surface. Therefore, the water vapour partial pressure close to the wafer increases aria the selectivity is easily lost. In this example, the reaction chamber was isolated after supplying the etching gas mixture. Therefore, the water vapour formed in the etching process increased the water vapour partial pressure with a result of a changed etching atmosphere and mechanism.

As a countermeasure, another method was used as well. In this other method, the etching gases were supplied to the reaction chamber at low pressure while at the same time the reaction chamber was evacuated. In other words, the etching process was carried out with a constant supply of etching gas and a constant removal of reaction byproducts. With this method, it was possible to minimize the influence of the water vapour, formed in the etching process, on the etching mechanism. In fact, an etching rate ratio for BPSG and thermal oxide of around 1000 was obtained for a water vapour partial pressure up to 850 Pa with the hydrogen flouride partial pressure set at 600 Pa. However, as described in Example 2, the selectivity does not depend on the water vapour partial pressure only but on the hydrogen flouride partial pressure as well. Selective etching at a hydrogen flouride partial pressure of 100 Pa is realized for water vapour partial pressures up to 2000 Pa which in fact is important when the controllability of the process is considered.

EXAMPLE 4

The etching rate ratio of BPSG and thermal oxide was investigated for an etching process carried out at atmospheric pressure in an environment containing pure hydrogen flouride vapour (purity: 99.999%) or a hydrogen flouride and water vapour mixture and in which the silicon substrate temperature was varied.

In case of etching with pure hydrogen flouride, which means no water vapour supply, an etching rate ratio of only 20 was obtained for silicon substrate temperatures up to the order of 30° C. On the other hand, an etching rate ratio of 1000 was obtained in case the silicon substrate was heated to 70° C., even when 5% water vapour was added to the etching atmosphere.

From this it is understood that by heating the silicon substrate and layers on it a wide process range can be obtained in which thermal oxide is hardly etched and in which selective etching can be realized.

EXAMPLE 5

The etching rate ratio of BPSG to thermal oxide is shown in Table 2 for three different water vapour pressure (0, 600, and 1200 Pa) and two different temperatures (20° C. and 70° C.) in case of low pressure etching with the hydrogen flouride partial pressure fixed at 600 Pa.

TABLE 2

| | | P(HF)/P(H$_2$O) | | |
|---|---|---|---|---|
| | substrate temperature | 600 Pa/ 0 Pa | 600 Pa/ 600 Pa | 600 Pa/ 1200 Pa |
| etching rate ratio of BPSG to thermal oxide | 20° C. 70° C. | 2000 2000 | 50 2000 | 20 1500 |

It was found that the etching rate ratio of BPSG to thermal oxide dropped to far when the water vapour partial pressure was increased above 900 Pa in case of etching at a temperature of 20° C., while in case of etching at 70° C. an etching rate ratio higher than 1000 was found even when 1200 Pa water vapour was added to the etching environment.

From the above, it is understood that in case of low pressure hydrogen flouride vapour etching the process window can be widened by heating the substrate and the layers on it.

EXAMPLE 6

The etching rate ratio of BPSG to thermal oxide was investigated for an etching process, carried out at atmospheric pressure, in which the etching gas supply lines (93) (FIG. 4) were heated in order to increase the temperature of the etching gas. The etching gas was either pure hydrogen flouride (purity: 99.999%) or a hydrogen flouride and water vapour mixture.

It was found that the etching rate ratio was in the order of 10 when the gas lines were not heated and in the order of 1500 when the gas lines were heated.

One can conclude that the process window, in which selective etching with an etching rate ratio higher than 1000 is possible, can be widened by heating the etching gases.

In fact, during these experiments, the temperature of the silicon substrate increased to 50° C. within one minute due to the heat transfer from the heated etching gas to the substrate. Regarding methods to heat the etching gas, it was confirmed that heating the reaction chamber with the heater element 43 (FIG. 4) affects the etching rate ratio similar way.

EXAMPLE 7

The etching rate ratio of BPSG to thermal oxide was investigated for an etching process, carried out at low pressure, in which the etching gas supply lines 93 (FIG. 4) were heated in order to increase the temperature of the etching gas. The etching gas was a mixture of hydrogen flouride and water vapour. The partial pressures of both the hydrogen flouride and the water vapour were fixed at 600 Pa.

It was found that the etching rate ratio was in the order of 30 when the gas lines were not heated an above 1000 when the gas lines were heated. From this, it is understood that the process window, in which selective etching with an etching rate ratio higher than 1000 is possible, can be widened by heating the etching gas.

Regarding methods to heat the etching gas, it was confirmed that heating the reaction chamber with the heater element 43 (FIG. 4) affects the etching rate ratio in a similar way.

EXAMPLE 8

The effect of adding, to the gaseous etching atmosphere, a gas (ethanol) that causes a liquid adsorption layer comprising hydrogen fluoride and water and formed on the undoped oxide layer to volatilize, was investigated. The etching process was carried out at atmospheric pressure with the etching environment containing either pure hydrogen flouride vapour (purity: 99.999%) or a hydrogen flouride and water vapour mixture. The ethanol gas was supplied to the etching environment by opening valve 83(3) (FIG. 4). The concentration of ethanol was 10% of the total amount of etching gas. The etching rate ratio of BPSG to thermal oxide was 10 when no ethanol was added and 1000 when ethanol was added. From this, it is understood that the process window, in which selective etching with an etching rate ratio higher than 1000 is possible, can be widened by adding a gas that reduces the boiling point of the gas mixture.

In this example, the effect of adding ethanol to an atmospheric etching environment is shown. However the effect of adding ethanol to a low pressure etching environment is even more pronounced. In fact, in case of low pressure etching at room temperature with partial pressures for hydrogen flouride, water vapour, and ethanol set at 600 Pa, 600 Pa, and 200 Pa, respectively, the etching rate ratio of BPSG to thermal oxide larger than 1000 was found.

Furthermore, when the reaction chamber or the gas was heated to 70° C., an etching rate ratio larger than 1000 was obtained for a low pressure etching process in which the partial pressures of hydrogen flouride, water vapour, and ethanol were set at 600 Pa, 100 Pa, and 200 Pa, respectively.

EXAMPLE 9

As mentioned before, a water adsorption layer is formed on the wafer surface 111 during etching. It was confirmed that this water adsorption layer can be effectively removed by heating the substrate with the heater element 73 after finishing the etching process. By heating the substrate the water adsorption layer is vaporized.

EXAMPLE 10

Heating the wafer is an effective method to vaporize the water adsorbed at the wafer surface in case the adsorption layer contains only water, as mentioned in Example 9. However, when etching phosphorus containing oxides, phosphorus will be present in the adsorption layer at the surface of the wafer. In that case, heating of the wafer alone will result in a phosphorus residue on the surface of the wafer. Therefore, during the heat treatment, flouride gas was supplied to the reaction chamber. It was found this treatment resulted in an effective vaporization of the phosphorus containing compounds and therefore a clean wafer surface.

What is claimed is:

1. Apparatus for etching a silicon oxide layer formed on each of wafers in a gaseous etching atmosphere consisting essentially of hydrogen fluoride or a mixture of hydrogen fluoride and water vapor, said apparatus comprising:

a reaction chamber in which an etching process takes place, wherein said reaction chamber comprises an external tube and an inner tube placed in said external tube, said inner tube having openings through its peripheral wall to supply the etching gas from said reaction chamber into said inner tube through a space between said external tube and said inner tube and through said openings;

a wafer boat for holding said wafers with a space of a specific interval left between two adjacent ones of said wafers, said wafer boat comprising heating means for individually heating said wafers;

a transfer chamber which is located below said reaction chamber and in which said wafer boat is loaded with wafers;

a boat transfer mechanism for transferring said wafer boat from said transfer chamber to said reaction chamber;

a gas exhausting system for exhausting said reaction chamber to make said gaseous etching atmosphere have a reduced pressure in said reaction chamber;

a sealing mechanism for isolating said reaction chamber from said transfer chamber;

means for heating said reaction chamber;

a gas mixing chamber to which a plurality of individual etching gases and a voltalization acceleration gas are supplied to provide a gas mixture;

gas supplying means for supplying said gas mixture toward said reaction chamber; and a heater unit connected to said gas supplying means for heating said gas mixture to a heated gas mixture;

said gas supplying means supplying said heated gas mixture to said reaction chamber as said gaseous etching atmosphere.

2. Apparatus for etching a silicon oxide layer formed on each of wafers in a gaseous etching atmosphere consisting essentially of hydrogen fluoride or a mixture of hydrogen fluoride and water vapor, said apparatus comprising:

a reaction chamber in which an etching process takes place;

a wafer boat for holding said wafers with a space of a specific interval left between two adjacent ones of said wafers, said wafer boat comprising heating means for individually heating said wafers;

a transfer chamber which is located below said reaction chamber and in which said wafer boat is loaded with wafers;

a boat transfer mechanism for transferring said wafer boat from said transfer chamber to said reaction chamber;

a gas exhausting system for exhausting said reaction chamber to make said gaseous etching atmosphere have a reduced pressure in said reaction chamber;

a sealing mechanism for isolating said reaction chamber from said transfer chamber;

means for heating said reaction chamber;

a gas mixing chamber to which a plurality of individual etching gases and a voltalization acceleration gas are supplied to provide a gas mixture;

gas supplying means for supplying said gas mixture toward said reaction chamber; and a heater unit connected to said gas supplying means for heating said gas mixture to a heated gas mixture;

said gas supplying means supplying said heated gas mixture to said reaction chamber as said gaseous etching atmosphere.

\* \* \* \* \*